(12) United States Patent
Chantre

(10) Patent No.: US 6,384,469 B1
(45) Date of Patent: May 7, 2002

(54) VERTICAL BIPOLAR TRANSISTOR, IN PARTICULAR WITH AN SIGE HETEROJUNCTION BASE, AND FABRICATION PROCESS

(75) Inventor: Alain Chantre, Seyssins (FR)

(73) Assignee: France Telecom, Paris (FR)

( * ) Notice: Subject to any disclaimer, the term of this patent is extended or adjusted under 35 U.S.C. 154(b) by 0 days.

(21) Appl. No.: 09/674,021

(22) PCT Filed: Apr. 14, 1999

(86) PCT No.: PCT/FR99/00867

§ 371 Date: Oct. 23, 2000

§ 102(e) Date: Oct. 23, 2000

(87) PCT Pub. No.: WO99/54939

PCT Pub. Date: Oct. 28, 1999

(30) Foreign Application Priority Data

Apr. 22, 1998 (FR) .............................. 98 05019

(51) Int. Cl.$^7$ ...................... H01L 27/082; H01L 27/102
(52) U.S. Cl. ................. 257/565; 257/197; 438/312
(58) Field of Search ................. 257/197, 565; 438/312

(56) References Cited

U.S. PATENT DOCUMENTS

| | | | | |
|---|---|---|---|---|
| 3,600,651 A | * | 8/1971 | Duncan ........................ | 257/263 |
| 5,073,810 A | * | 12/1991 | Owada et al. ............... | 257/588 |
| 5,117,271 A | * | 5/1992 | Comfort et al. ............. | 257/198 |
| 6,043,552 A | * | 3/2000 | Miwa .......................... | 257/587 |
| 6,100,152 A | * | 8/2000 | Emons et al. ................ | 438/350 |

FOREIGN PATENT DOCUMENTS

| | | | |
|---|---|---|---|
| EP | 0350610 A2 | * | 1/1990 |
| JP | 1006515 A | * | 3/1998 |

OTHER PUBLICATIONS

Burghartz et al., Self–Aligned SiGe–Base Heterojunction Bipolar Transistor by Selective Epitaxy Emitter Window (SEEW) Technology, IEEE Elec. Device Lett., 11 (Jul. 1990) 288.*

Nguyen–Ngoc et al, Ion–Implanted Base SiGe PNP Self–Aligned SEEW Transistors, IEEE Bipolar Cir. Tech. Mtg., 1991, p. 75.*

* cited by examiner

Primary Examiner—Richard Elms
Assistant Examiner—Christian D. Wilson
(74) Attorney, Agent, or Firm—Eric B. Meyertons; Conley, Rose & Tayon, P.C.

(57) ABSTRACT

The semiconductor region of an intrinsic collector is surrounded with a lateral insulating region. A semi-conducting layer comprising a SiGe heterojunction is partially located between the transmitter and the intrinsic collector and extends on either side of the transmitter above the lateral insulating region. The base intrinsic region is formed in said semi-conducting layer with heterojunction between the transmitter and the intrinsic collector. The base extrinsic region and the collector extrinsic region respectively comprise first zones formed in said semi-conducting layer with heterojunction, located respectively on either side of the transmitter and above the lateral insulating region first part and mutually electrically insulated by the lateral insulating region second part.

18 Claims, 3 Drawing Sheets

VERTICAL BIPOLAR TRANSISTOR, IN PARTICULAR WITH AN SIGE HETEROJUNCTION BASE, AND FABRICATION PROCESS

FIELD OF THE INVENTION

Generally the invention relates to vertical bipolar transistors, and more specifically to high-speed bipolar transistors having an SiGe (silicon-germanium) heterojunction base.

SUMMARY OF THE INVENTION

In one embodiment, a method of making a compact, high-speed bipolar transistor of low complexity, having a low collector-substrate capacitance and a low capacitance between the extrinsic base and the collector is described.

Consequently, the bipolar transistor includes an intrinsic collector semiconductor region surrounded by a lateral isolation region; a semiconductor layer, includes for example a SiGe heterojunction, situated partially between the emitter and the intrinsic collector and extending on either side of the emitter above the lateral isolation region. The bipolar transistor includes an intrinsic base region formed in said semiconductor layer between the emitter and the intrinsic collector. It also includes an extrinsic base region and an extrinsic collector region including respectively first zones formed in said semiconductor layer. These first zones are situated respectively on either side of the emitter and above a first part of the lateral isolation region and are mutually isolated electrically by a second part of the lateral isolation region. The extrinsic base and extrinsic collector regions also includes second zones extending into the intrinsic collector, in practice produced by implantation. Finally, base and collector metallizations are respectively situated in contact with said first corresponding zones above said first part of the lateral isolation region.

In other words, the bipolar transistor according to the invention does not have an extrinsic collector formed from a collector well and from a buried layer. Here, the extrinsic collector is formed mainly in the semiconductor layer, for example with a heterojunction. The base, and consequently the base metallization, does not completely surround the emitter. As a result, the extrinsic collector and extrinsic base regions need to be isolated electrically, may be achieved by a part of the lateral isolation region.

The bipolar transistor therefore has not only a base metallization protruding into the field oxide, but also an extrinsic collector metallization protruding into the field oxide, which contributes to further increasing the operating speed of the transistor and which makes it possible to obtain both a low extrinsic base-collector capacitance and also a low collector-substrate capacitance.

Furthermore, the absence of an offset collector well makes it possible to obtain a particularly compact bipolar transistor.

According to one embodiment, the transistor includes two layers of amorphous silicon lying on the first part of the lateral isolation region, under said first zones of the extrinsic base and of the extrinsic collector, respectively, these two amorphous silicon layers protruding respectively beyond the lateral isolation region in the direction of the emitter.

The presence of these amorphous silicon layers makes it possible, during selective epitaxy which is one of the characteristics of the fabrication process, to obtain a growth rate which is approximately the same for the polycrystalline silicon of the semiconductor layer, growing above the field oxide zone, and for the single-crystal silicon of this semiconductor layer growing over the silicon region of the intrinsic collector.

According to one embodiment of the, the emitter region includes a projecting zone surrounded by isolating spacers and extending into a narrower window in contact with the intrinsic base. The distance between the edge of the window and the isolating spacer situated on the intrinsic collector side is thus advantageously greater than the distance between the edge of the window and the isolating spacer situated on the extrinsic base side. This makes it possible to avoid, during n+implantation, for example of the intrinsic collector, having a protrusion of this implanted zone into the window of the emitter.

In one embodiment a process for fabricating a vertical bipolar transistor is described. The process includes implanting an intrinsic collector region into a semiconductor substrate zone surrounded by a lateral isolation region and producing extrinsic base, intrinsic base and extrinsic collector regions. This production step includes the formation, by selective epitaxy, of a semiconductor layer, for example with a SiGe heterojunction layer, extending over the intrinsic collector region and above the lateral isolation region. This production step also includes implantations of dopants through the first predetermined zones of this semiconductor layer, for example this heterojunction layer, said zones being situated respectively on either side of the intrinsic collector and above a first part of the lateral isolation region and being mutually isolated electrically by a second part of the lateral isolation region. Implantations are also provided in second predetermined zones of the intrinsic collector. In this way, the extrinsic base and extrinsic collector regions are formed. The process also includes a step of producing the contact metallizations including the production of the base and collector contact metallizations respectively on either side of the emitter region and above the first part of the lateral isolation region.

It should be noted here that the production of the collector, by implantation, and not by epitaxy, contributes to reducing the complexity, and consequently the cost, of producing the transistor.

According to one method of implementing the process, the formation of the semiconductor layer, for example the heterojunction layer, includes the deposition of an amorphous silicon layer on the intrinsic collector and on the lateral isolation region; the etching of this amorphous silicon layer so as to leave, on each side of the exposed surface of the intrinsic collector, two distinct amorphous silicon zones extending respectively over the first part of the lateral isolation region and protruding respectively over the exposed surface of the intrinsic collector, followed by said selective epitaxy on the exposed zone of the intrinsic collector and on the two distinct amorphous silicon zones.

The process furthermore includes advantageously producing the emitter region, by depositing an insulating bilayer on the semiconductor layer, for example the heterojunction layer, then etching of the bilayer so as to produce a window exposing a zone of the semiconductor layer situated above the intrinsic collector. This process also includes the deposition of a polysilicon layer on the unetched part of the insulating bilayer and in said window, then the etching of the polysilicon so as to make a protecting polysilicon part which is wider than the window, the distance between the edge of the window and the edge of the projecting part on the extrinsic collector side being larger than the distance between the edge of the window and the edge of the projecting part on the extrinsic base side.

BRIEF DESCRIPTION OF THE DRAWINGS

Further advantages and characteristics of the invention will appear on examination of the detailed description of one method of implementing the process and of one embodiment, which is in no way limiting, and the appended drawings in which.

DETAILED DESCRIPTION OF THE PREFERRED EMBODIMENTS

Figure 1:
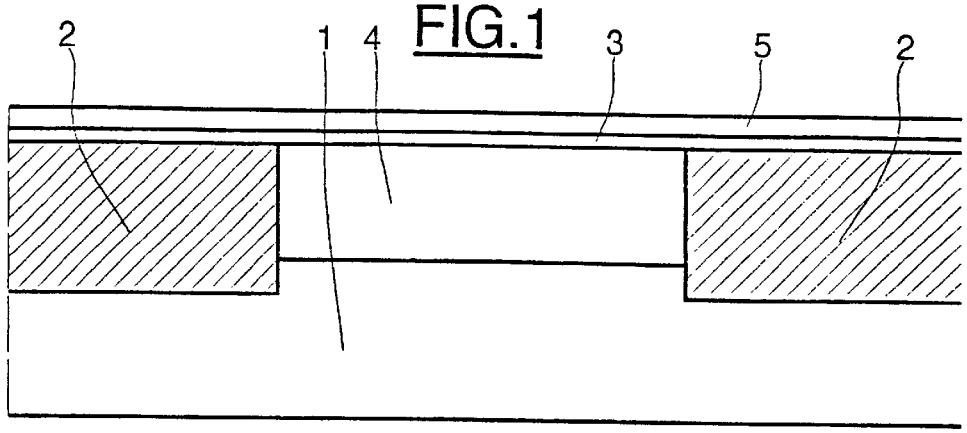
FIGS. 1 to 5 illustrate schematically a method of implementing the process according to the invention, making it possible to obtain a transistor according to the invention.
Figure 2:
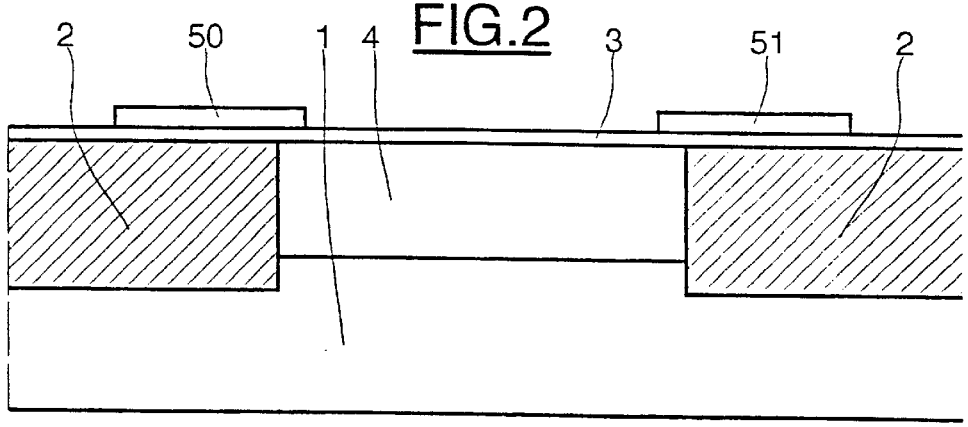

In FIG. 1, the reference 1 generally denotes a semiconductor substrate of the p type (for example). After having defined, in a conventional manner known per se, the active region of the bipolar transistor by lateral isolation regions 2 (field oxide) (for example using the conventional LOCOS process or even a process for lateral isolation by narrow and shallow trenches) an insulating stop layer 3, formed from silicon dioxide ($SiO_2$) and having a typical thickness of about 100 Å is deposited.

Then a conventional n-type implantation is carried out in the active zone so as to produce the intrinsic collector region.

Next, on this semiconductor block thus formed, an amorphous silicon layer 5, typically having a thickness of 500 Å, is deposited.

Figure 3:
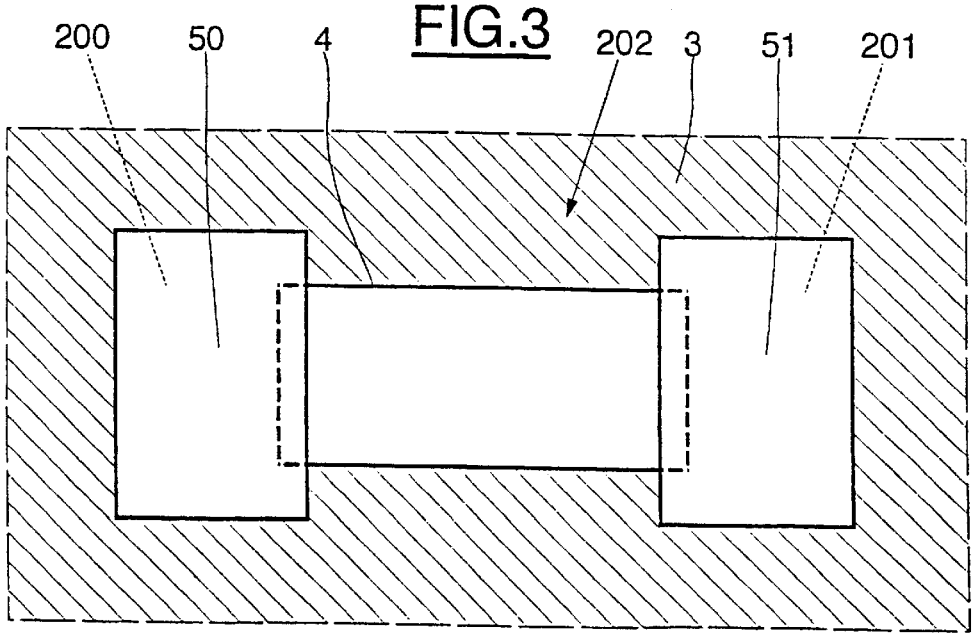

After photolithography of this amorphous silicon layer 5, conventional etching of this layer is carried out, stopping on the oxide layer 3. Thus, after etching and conventional deoxidization, two amorphous silicon layers 50 and 51 (FIGS. 3 and 4) are obtained, extending over a first part 200 and 201 of the lateral isolation region 2, and mutually isolated electrically by a second part 202 from this lateral isolation region. These two amorphous silicon layers 50 and 51 also protrude over the surface of the intrinsic collector 4, exposed after deoxidization.

Next (FIG. 4), a heterojunction layer 6 is produced by selective epitaxy. More specifically, this heterojunction layer includes a stack of a first silicon sublayer surmounted by a $Si_{1-x}Ge_x$ sublayer (where x is typically about 10%), this second sublayer itself being encapsulated by another silicon sublayer.

The epitaxy is selective in the sense that the growth of the heterojunction layer takes place only on the two amorphous silicon layers 50 and 51 and on the intrinsic collector region 4. There is no growth elsewhere, i.e. on the second part 202 of the lateral isolation region composed of $SiO_2$. Selective epitaxy is an operation which is well known to those skilled in the art. In particular it uses gases such as dichlorosilane ($SiH_2Cl_2$).

Because of the presence of the two amorphous silicon layers 50 and 51, polycrystalline silicon will grow on these two layers. Furthermore, single-crystal silicon will grow on the intrinsic collector region 4. Moreover, the presence of these layers 50 and 51 on the collector makes it possible to obtain a virtually identical growth rate for the single-crystal silicon and for the polycrystalline silicon. This would not have been the case if the silicon had been grown directly on oxide. Moreover, the protrusion of the layers 50 and 51 makes it possible to ensure that there are no parts formed from $SiO_2$ on which the selective epitaxy of the heterojunction layer would lead to an absence of silicon at these points.

The thickness of the heterojunction layer 6 is typically about 1000 to 1500 Å.

Figure 4:
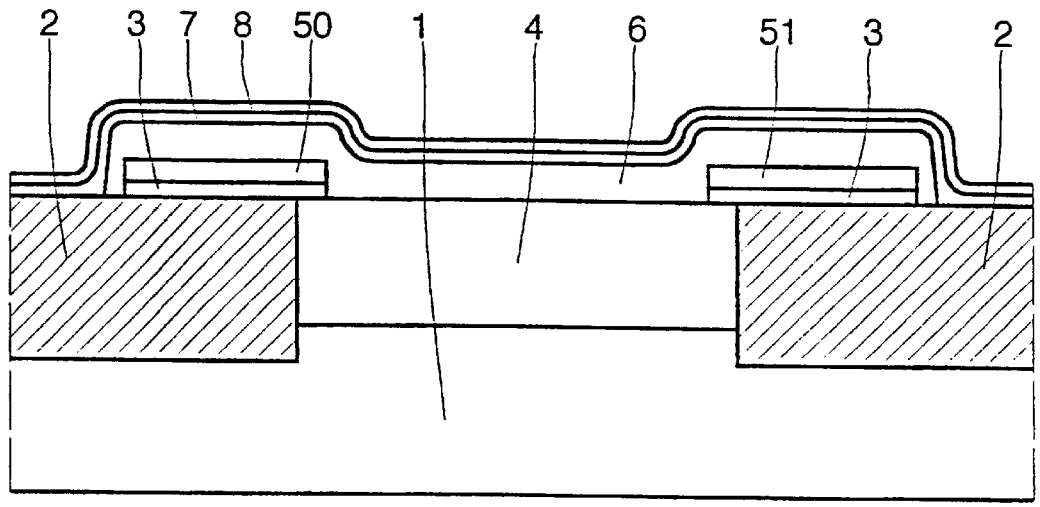

Next, an insulating bilayer formed from a silicon oxide $SiO_2$ first insulating layer 7 surmounted by a silicon nitride $Si_3N_4$ second insulating layer 8 is deposited on the heterojunction layer 6 (FIG. 4).

Figure 5:
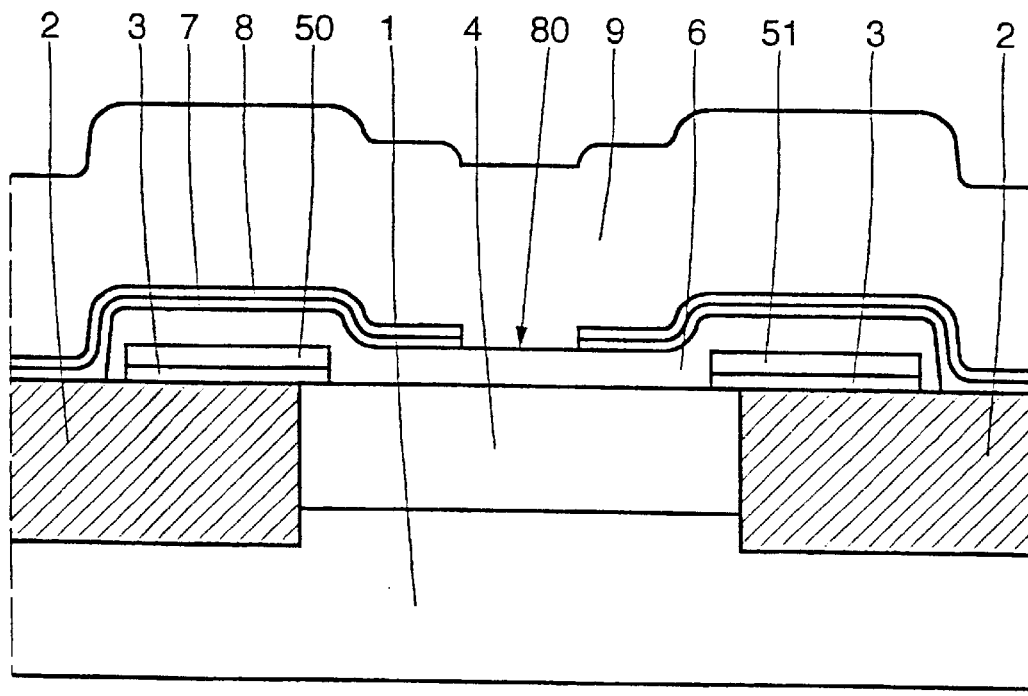

Next (FIG. 5), a photolithography step, which makes it possible to define the window 80 of the emitter, is carried out, followed by etching of the insulating bilayer 7, 8 so as actually to define the emitter window 80. The etching of the silicon nitride layer is plasma etching stopping on the silicon oxide layer 7, while the etching of the oxide layer 7 is chemical etching using the silicon nitride layer as a mask.

Figure 6:
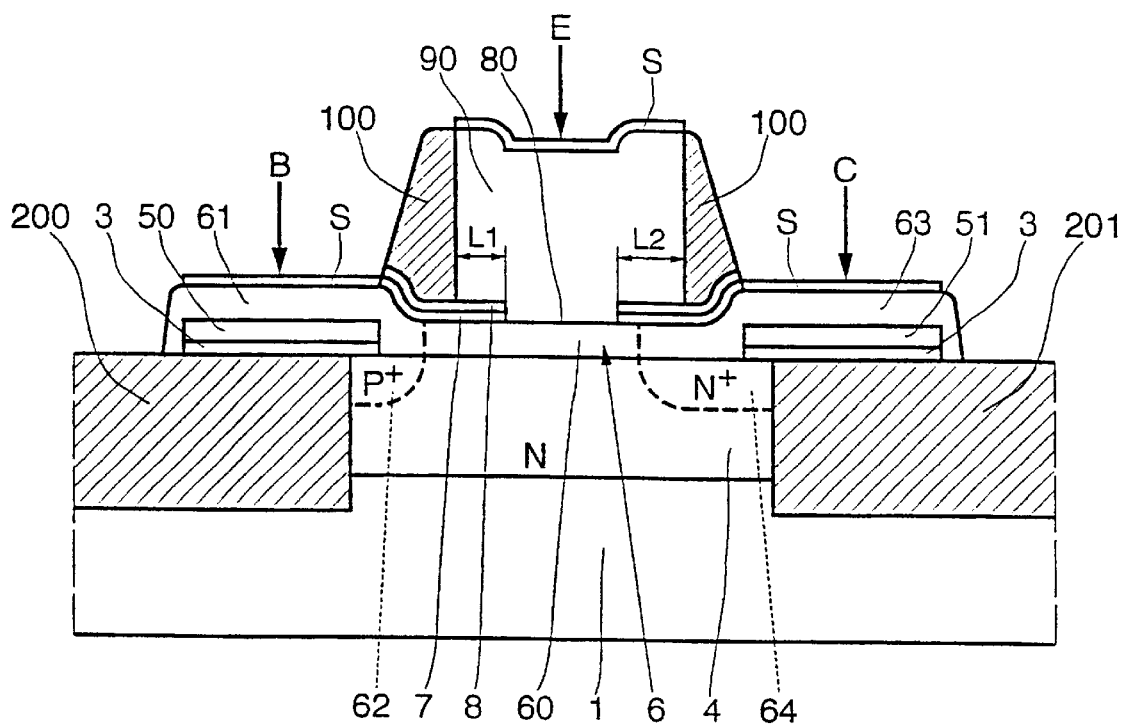
FIG. 6 illustrates schematically a structure of a bipolar transistor according to the invention.

An $n^+$-doped polysilicon layer 9, typically having a thickness of about 2500 ångströms, is then deposited and then etched so as to form the emitter region 90 formed from polysilicon (FIG. 6).

In this respect, the polysilicon of the emitter is advantageously etched in an asymmetric matter so as to obtain a distance L1, between the edge of the window 80 and the edge of the region 90, which is shorter than the distance L2 between the edge of the window 80 and the edge of the region 90. This makes it possible to take into account the difference in lateral diffusion between the implants of the intrinsic base and of the extrinsic collector, which will be described hereinbelow.

Spacers 100, formed from silicon nitride, are then formed by deposition and anisotropic etching in a conventional manner known per se.

After masking, a $p^+$-type implantation, for example with boron ions, of the assembly thus obtained is then carried out so as to make the extrinsic base. Similarly, an $n^+$-type implantation (for example based on phosphorus) is carried out on the assembly thus obtained so as to make the extrinsic collector.

After annealing and deposition of titanium to form, in a conventional manner by a silicide process, a silicide S on the base, the collector and the emitter, providing the contact areas, the transistor illustrated in FIG. 6 is obtained.

This transistor includes an intrinsic base 60 with an SiGe heterojunction lying between the polysilicon emitter 90 and the intrinsic collector 4. The extrinsic base includes a first zone 61 formed in the heterojunction layer 6 and lying on one side of the emitter, as well as a second implanted zone 62 protruding into the intrinsic collector. The extrinsic collector includes a first zone 63 formed in the heterojunction layer 6 on the other side of the emitter, and a second implanted zone 64 protruding into the intrinsic collector.

The first zones 61 and 63 of the extrinsic base and of the extrinsic collector are situated above the field oxide 200 and 201. Consequently, the same applies for the contact metallizations.

Although the invention has been described with a semiconductor heterojunction layer 6 leading to the production of a heterojunction base for the vertical transistor, which makes it possible to optimize the adjustment of the transistor and especially to further increase its speed (i.e. to increase the transition frequency and the maximum oscillation frequency), the invention can be applied equally to any type of epitaxially grown base, in particular an all-silicon base, and makes it possible especially to obtain, even with any type of base, a low collector-substrate capacitance and a low extrinsic base-collector capacitance.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A vertical bipolar transistor, comprising an intrinsic collector semiconductor region surrounded by a lateral isolation; a semiconductor layer situated partially between the emitter and the intrinsic collector and extending on either side of the emitter above the lateral isolation region; an intrinsic base region formed in said semiconductor layer between the emitter and the intrinsic collector, an extrinsic base region and an extrinsic collector region comprising respectively first zones formed in said semiconductor layer, said zones being situated respectively on either side of the emitter and above a first part of the lateral isolation region and mutually isolated electrically by a second part of the lateral isolation region as well as second zones extending into the intrinsic collector and base and collector metallizations respectively situated in contact with said first corresponding zones above said first part of the lateral isolation region.

2. The transistor as claimed in claim 1, further comprising two amorphous silicon layers lying on the first part of the lateral isolation region under said first zones of the extrinsic base and of the extrinsic collector, respectively, and protruding respectively beyond the lateral isolation region in the direction of the emitter.

3. The transistor as claimed in claim 1 wherein the emitter region comprises a projecting zone surrounded by isolating spacers and extending into a narrower window in contact with the intrinsic base, and in that the distance between the edge of the window and that the distance between the edge of the window and the isolating spacer situated on the extrinsic collector side is greater than the distance between the edge of the window and the isolating spacer situated on the extrinsic base side.

4. The transistor as claimed in claim 1, wherein the semiconductor layer comprises an SiGe heterojunction.

5. A process for fabricating a bipolar transistor, a comprising implanting an intrinsic collector region into a semiconductor substrate zone surrounded by a lateral isolation region; producing extrinsic base, intrinsic base and extrinsic collector regions, forming, by selective epitaxy, a semiconductor layer extending over the intrinsic collector region and above the lateral isolation region; implanting dopants through first predetermined zones of the semiconductor layer, said zones being situated respectively on either side of the intrinsic collector and above a first part of the lateral isolation region and being mutually isolated electrically by a second part of the lateral isolation region and, implanting dopants into second predetermined zones of the intrinsic collector, so as to form the extrinsic base and intrinsic collector regions; and producing the contact metallizations, wherein producing the contact metallizations comprises forming the base and collector contact metallizations respectively on either side of the emitter region and above the first part of the lateral isolation region.

6. The process as claimed in claim 5, wherein the formation of the semiconductor layer includes the deposition of an amorphous silicon layer on the intrinsic collector and on the lateral isolation region; etching of the amorphous silicon layer so as to leave, on each side of the exposed surface of the intrinsic collector, two distinct amorphous silicon zones extending respectively over the first part of the lateral isolation region and protruding respectively over the exposed surface of the intrinsic collector, followed by said selective epitaxy on the exposed zone of the intrinsic collector and on the two distinct amorphous silicon zones.

7. The process as claimed in claim 5 further comprising producing the emitter region, wherein producing the emitter region comprises depositing an insulating bilayer on the semiconductor layer etching the bilayer so as to produce a window exposing a zone of the semiconductor layer situated above the intrinsic collector; depositing a polysilicon layer on the unetched part of the insulating bilayer and in said window, and etching the polysilicon so as to make a protecting polysilicon which is wider than the window, the distance between the edge of the window and the edge of the projecting part on the extrinsic collector side being larger than the distance between the edge of the window and the edge of the projecting part on the extrinsic base side.

8. A vertical bipolar transistor, comprising:
   an intrinsic collector semiconductor region surrounded by a lateral isolation region;
   a semiconductor layer situated partially between the emitter and the intrinsic collector and extending on either side of the emitter above the lateral isolation region;
   an intrinsic base region formed in said semiconductor layer between the emitter and the intrinsic collector; and
   an extrinsic base region and an extrinsic collector region, portions of both the extrinsic base region and the extrinsic collector region being situated on either side of the emitter and above a first part of the lateral isolation region.

9. The transistor of claim 8, wherein the portions of the extrinsic base region and the extrinsic collector region are mutually isolated electrically by a second part of the lateral isolation region.

10. The transistor of claim 8, further comprising base and collector metallizations respectively situated on the portions of the extrinsic base region and the extrinsic collector region.

11. The transistor of claim 8, further comprising silicon layers lying on the first part of the lateral isolation region under the portions of the extrinsic base and of the extrinsic collector and protruding respectively beyond the lateral isolation region in the direction of the emitter.

12. The transistor of claim 8 wherein the emitter region includes a projecting zone surrounded by isolating spacers and extending into a narrower window in contact with the intrinsic base, and the distance between the edge of the window and the isolating spacer situated on the extrinsic collector side is greater than the distance between the edge of the window and the isolating spacer situated on the extrinsic base side.

13. The transistor of claim 8, wherein the semiconductor layer comprises a SiGe heterojunction.

14. A process for fabricating a bipolar transistor, comprising:
   implanting an intrinsic collector region into a semiconductor substrate zone surrounded by a lateral isolation region;

producing extrinsic base, intrinsic base and extrinsic collector regions by selective epitaxy a semiconductor layer extending over the intrinsic collector region and above the lateral isolation region;

implanting dopants through portions of the semiconductor layer, said portions being situated on either side of the intrinsic collector and above a first part of the lateral isolation region.

15. The process of claim 14, further comprising producing contact metallizations on either side of the emitter region and above the first part of the lateral isolation region.

16. The process of claim 14 wherein the formation of the semiconductor layer includes:

depositing an amorphous silicon layer on the intrinsic collector and on the lateral isolation region;

etching the amorphous silicon layer such that, on each side of the exposed surface of the intrinsic collector, two distinct amorphous silicon zones extending respectively over the first part of the lateral isolation region and protruding respectively over the exposed surface of the intrinsic collector are formed.

17. The process of claim 16, further comprising performing selective epitaxy on the exposed zone of the intrinsic collector and on the two distinct amorphous silicon zones.

18. The process of claim 16, further comprising producing the emitter region, wherein producing the emitter region includes:

depositing an insulating bilayer on the semiconductor layer;

etching the bilayer so as to produce a window exposing a zone of the semiconductor layer situated above the intrinsic collector;

depositing a polysilicon layer on the unetched part of the insulating bilayer and in said window; and etching the polysilicon so as to make a protecting polysilicon which is wider than the window, the distance between the edge of the window and the edge of the projecting part on the extrinsic collector side being larger than the distance between the edge of the window and the edge of the projecting part on the extrinsic base side.

\* \* \* \* \*

UNITED STATES PATENT AND TRADEMARK OFFICE
CERTIFICATE OF CORRECTION

PATENT NO. : 6,384,469 B1
DATED : May 7, 2002
INVENTOR(S) : Chantre

It is certified that error appears in the above-identified patent and that said Letters Patent is hereby corrected as shown below:

Column 5,
Line 50, please delete "a comprising" and substitute therefor -- comprising --.

Column 6,
Line 2, please delete "includes" and substitute therefor -- comprises --.

Column 7,
Line 14, please delete "includes" and substitute therefor -- comprises --.

Column 8,
Line 6, please delete "includes" and substitute therefor -- comprises --.

Signed and Sealed this

Twenty-ninth Day of October, 2002

*Attest:*

JAMES E. ROGAN
*Attesting Officer*   *Director of the United States Patent and Trademark Office*